United States Patent [19]

Muterspaugh

[11] Patent Number: 4,703,286

[45] Date of Patent: Oct. 27, 1987

[54] DUAL GATE TUNABLE OSCILLATOR

[75] Inventor: Max W. Muterspaugh, Indianapolis, Ind.

[73] Assignee: RCA Corporation, Princeton, N.J.

[21] Appl. No.: 935,440

[22] Filed: Nov. 26, 1986

[51] Int. Cl.[4] .............................................. H03B 5/00
[52] U.S. Cl. .......................... 331/117 FE; 331/177 V; 455/195; 455/318
[58] Field of Search ........ 331/117 FE, 117 R, 117 D, 331/177 V, 46, 37; 375/106; 455/313, 318, 179, 195, 196; 334/15

[56] References Cited

U.S. PATENT DOCUMENTS 3,723,905  3/1973  Sterner et al. ...................... 331/109
4,458,215  7/1984  Huang et al. ....................... 331/117
4,596,955  6/1986  Horvat et al. ...................... 329/122

OTHER PUBLICATIONS

Pp. 6-1 thru 6-7 of the book "1982 The Radio Amateur's Handbook", published in 1981.
Pp. 307-310 of the book "Transistor Circuit Design", published by McGraw-Hill in 1963.

Primary Examiner—Eugene R. LaRoche
Assistant Examiner—Robert J. Pascal
Attorney, Agent, or Firm—Eugene M. Whitacre; Paul J. Rasmussen; Peter M. Emanuel

[57] ABSTRACT

A dual gate field effect transistor (FET) is configured as a self-buffering local oscillator of a tuner by arranging the FET in a cascode configuration in which the first gate electrode is coupled to the source electrode through an oscillation conditioning network and also to a frequency determining network, the second gate electrode is coupled to signal ground through a negligible impedance and the drain electrode is utilized as the output of the oscillator.

11 Claims, 5 Drawing Figures

Н,703,286

DUAL GATE TUNABLE OSCILLATOR

RELATED APPLICATIONS

U.S. application Ser. No. 935,438 entitled "Wide Range Oscillator" and U.S. application Ser. No. 935,439 entitled "FET Tuner" concurrently filed in the name of the same inventor are related applications.

FIELD OF THE INVENTION

The present invention is in the field of tunable oscillators that may be employed, e.g., as the local oscillator of a tuning system.

BACKGROUND OF THE INVENTION

Tuning systems for radio and television receivers typically include a tunable RF stage for selecting the RF signal corresponding to a desired station or channel from a plurality of received RF signals, a tunable local oscillator for generating a local oscillator signal having a frequency corresponding to the desired station or channel and a mixer for heterodyning the selected RF signal with the local oscillator signal to produce an IF signal corresponding to the RF signal.

The local oscillator should be capable of generating a local oscillator signal of sufficient amplitude to reliably drive the mixer and provide an output impedance compatible with the input impedance of the mixer for efficient power transfer. In addition, the local oscillator should be arranged so that the mixer does not significantly interfere with the operation of the local oscillator. While it is possible to employ a separate buffer amplifier in conjunction with the local oscillator to provide these desired features, it is not economical to do so.

SUMMARY OF THE INVENTION

In accordance with the present invention, a dual gate field effect transistor (FET) is configured as a self-buffering tunable oscillator. Specifically, the FET is arranged in a cascode arrangement in which the first gate electrode is coupled to the source electrode through a network for establishing the conditions for oscillation and also to a tuned circuit including a varactor diode and an inductance element for determining the particular frequency of oscillation, the second gate electrode is coupled to a reference potential and the output of the oscillator is taken at the drain electrode.

In the figures, various exemplary element values are identified in parenthesis. Unless otherwise indicated, resistance values are in ohms, the capacitance values are in picofarads and the inductance values are in nanohenries. Further with regard to the exemplary values, K represents 1000, M represents 1,000,000 and $\mu$ (micro) represents 0.000001.

DESCRIPTION OF THE PREFERRED EMBODIMENT

Figure 1:
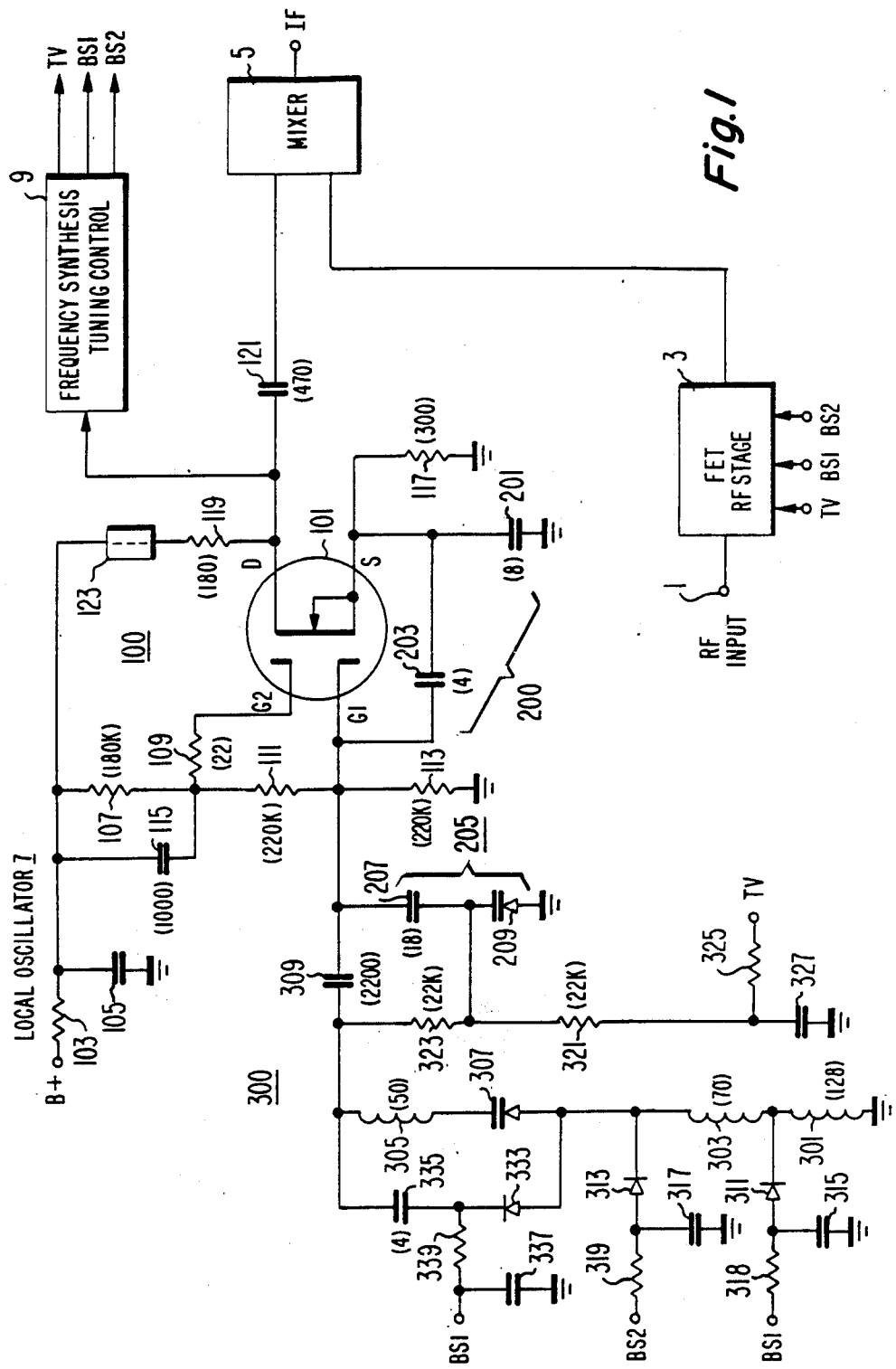
FIG. 1 is a schematic diagram showing a tuner of a television receiver embodying the present invention.

FIG. 1 shows the VHF section of a tuner of a television receiver for tuning VHF broadcast and VHF cable channels. RF signals provided by a source (not shown) such as an antenna or cable distribution network are coupled via an RF input 1 to a tunable RF stage 3. RF stage 3 selects the RF signal corresponding to a desired channel in response to the magnitude of a tuning voltage (TV). The selected RF signal is coupled to a mixer 5 where it is heterodyned with a local oscillator signal generated by a local oscillator 7 having its frequency of oscillation controlled in response to the magnitude of the tuning voltage to produce an IF signal corresponding to the selected RF signal.

A tuning control unit 9 generates the tuning control voltage. Tuning control unit 9 also generates bandswitching voltages (BS1 and BS2) for selecting inductors to be included in frequency selective tuned circuits of RF stage 3 and local oscillator 7 in accordance with the tuning band of the desired channel. By way of example, tuning control unit 9 may include a phase-locked loop (PLL) type of frequency synthesizer for converting binary coded representations of the channel number of the desired channel to a tuning voltage of the appropriate magnitude and a logic network for generating the appropriate bandswitching voltage in response to the binary coded representations of the channel number.

Bandswitching voltages BS1 and BS2 can have either a low level, e.g., $-12$ volts, or a high level, e.g., $+12$ volts. The tuning bands and the respective levels of bandswitching voltages BS1 and BS2 are indicated in the following table.

| BS1 | BS2 | CHANNEL NOS. | RF FREQUENCY RANGE (MHz) | LO FREQUENCY RANGE (MHz) |
|---|---|---|---|---|
| LOW | LOW | 2 thru 6 | 55–88 | 101–129 |
| HIGH | LOW | A-5 thru 13 | 91–216 | 137–257 |
| HIGH | HIGH | J thru W + 28 | 217–468 | 263–509 |

Local oscillator 7 comprises an amplifier 100 including a dual gate N channel metal oxide semiconductor (MOS) field effect transistor (FET) 101 having a first gate electrode (G1), a second gate electrode (G2), an N-type conduction channel connected at one end to a source electrode (S) and at the other end to a drain electrode (D). The voltages at the gate electrodes determine the degree of conduction of the conduction channel. A source of positive supply voltage (B+), e.g., $+12$ volts, is provided by tuner control unit 9 when a VHF channel is selected. The positive supply voltage is filtered by a lowpass filter including a resistor 103 and a capacitor 105. The power supply return path is connected to signal ground. A voltage divider network including resistors 107, 109, 111 and 113 connected to the gate electrodes biases FET 101 to operate as linear amplifier. Resistor 109 serves to inhibit unwanted parasitic oscillations of FET 101.

In local oscillator 7, amplifier 100 is configured as a cascode amplifier by utilizing the first gate electrode (G1) of FET 101 as the input, effectively connecting the second gate electrode (G2) to signal ground through a bypass capacitor 115 (noting that resistor 109 has a very small value), coupling the source electrode (S) to signal ground through a resistor 117, and utilizing the drain electrode (D) as the output of the amplifier. The drain electrode (D) is coupled to the B+ power supply conductor through a load resistor 119 and to mixer 5 through a large valued DC blocking capacitor 121. A ferrite bead 123 is provided on the conductor between load resistor 119 and the B+ conductor as an inductive AC blocking filter element. The configuration of FET 101 may be thought of as a cascode amplifier because the first gate electrode (G1), the source electrode (S) and the lower end of the conduction channel are configured as a common source amplifier and the upper end of the conduction channel, the second gate electrode (G2) and the drain electrode (D) are configured as a common gate amplifier.

A circuit 200 for conditioning amplifier 100 to oscillate is coupled between the first gate electrode (G1) and the source electrode (S). A series-tuned circuit 300 responsive to the tuning voltage (TV) for determining the particular frequency of oscillation is coupled between the first gate electrode (G1) and signal ground.

Oscillator 7 is conditioned to oscillate in the following manner. In general, an amplifier will oscillate if two conditions are met: (1) there is zero phase shift around a loop including a path from the input to the output of the amplifier and a path from the output to the input; and (2) the gain around the loop is greater than unity. In the case of oscillator 7, the portion of FET amplifier 100 including the first gate electrode (G1), the source electrode (S) and the lower end of the conduction channel is conditioned to oscillate. While this portion is a common source amplifier with regard to the cascode amplifier configuration of FET 101, it is a common drain or source follow amplifier, with an input at the first gate electrode (G1) and the output at the source electrode (S), with regard to the oscillation configuration. Oscillation conditioning network 200, connected between the output of the common drain amplifier configuration at the source electrode (S) and the input at the first gate electrode (G1), includes a capacitor 201 connected in shunt with resistor 117 between the source electrode (S) and signal ground and a capacitor 203 connected between the source electrode (S) and the first gate electrode (G1). As will be appreciated, this configuration is of the Colpitts type.

With respect to the phase shift requirement for oscillation, there is substantially no phase shift between the input (G1) and the output (S) and there is a phase lag contributed by capacitor 201 and a compensating phase lead contributed by capacitor 203 between the output (S) and the input (G1). With respect to the gain requirement for oscillation, there is a voltage gain of slightly less than one due to source follower operation between the input (G1) and the output (S) but a voltage increase ("step-up") due to capacitors 201 and 203 between the output (S) and the input (G1). As a result, the conditions for oscillation are met and the source follower configuration will oscillate at the frequency determined by tuned circuit 300. The current through the resistor 117 connected to the source electrode (S) and through the conduction channel varies with the oscillation and the voltage across load resistor 119 connected to the drain electrode (D) varies accordingly.

The cascode amplifier configuration of FET 101 is advantageous in several respects. The common gate amplifier portion provided by bypassing the second gate electrode (G2) to signal ground substantially isolates the oscillatory portion from mixer 5 while additionally enabling mixer 5 to be driven at appropriate signal and impedance levels without the need for a separate buffer amplifier device. Due to the common gate amplifier portion, a virtual ground is effectively presented to the output of the common source amplifier portion so that impedance variations exhibited by the mixer, due, e.g., to amplitude variations in the RF signal coupled to it from RF stage 3, do not substantially effect either the frequency of oscillation or the conditions for establishing oscillation. Moreover, because of the isolation, the drive requirements of mixer 5 do not have to be compromised to satisfy the conditions necessary for oscillation.

Figure 2:
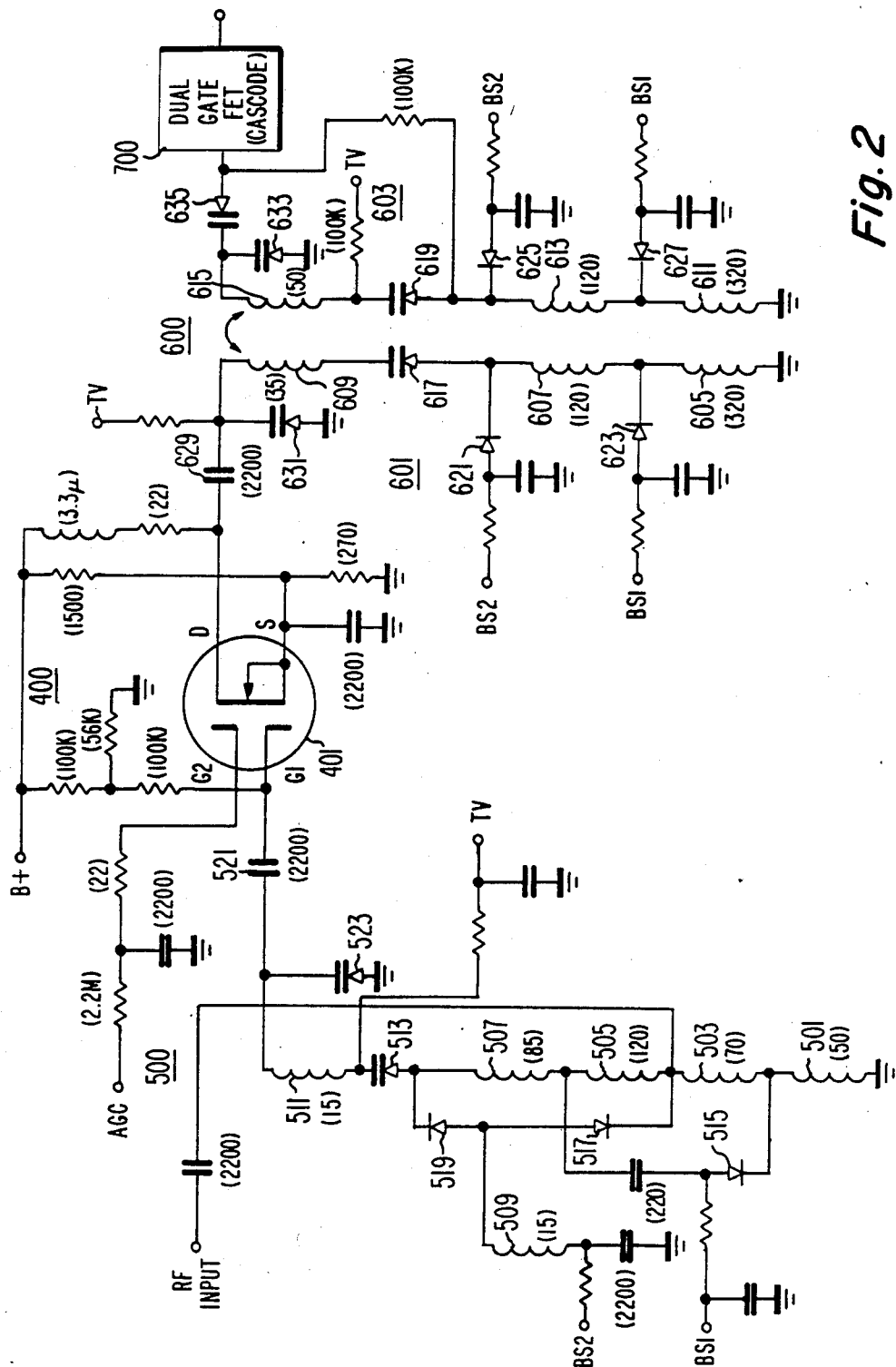
FIG. 2 is a schematic diagram showing in detail the RF stage of the tuner shown in block form in FIG. 1.

Another advantageous feature of FET local oscillator 7 is realized when it is employed with an FET RF stage. Many tuners used in television receivers employ dual gate FET RF stages because they produce relatively low distortion and have relatively high impedances compared with bipolar transistor RF stages. In addition, the second gate electrode provides a convenient means for applying an automatic gain control (AGC) voltage. A dual gate FET RF stage suitable for use as RF stage 3 is shown in FIG. 2 and will be explained in detail below. Briefly, the RF stage shown in FIG. 2 includes an amplifier 400 including a dual gate N MOS FET 401 configured, like FET 101 of local oscillator 7, as a cascode amplifier with the input at the first gate electrode (G1), the second gate electrode G2 effectively connected to signal ground through a bypass capacitor, the source electrode (S) coupled through a resistor to signal ground, and the output derived at the drain electrode (D). RF input 1 is coupled to the input (G1) of FET amplifier 400 through a series tuned circuit 500 responsive to the tuning voltage (TV). The output of FET amplifier 400 is coupled through a doubly tuned filter 600, comprising two inductively coupled series-tuned circuits 601 and 603 each responsive to the tuning voltage (TV), to another dual gate FET amplifier 700 also configured in cascode configuration. The output of dual gate FET amplifier 700 is coupled to mixer 5. Since RF stage 3 and local oscillator 7 have amplifiers of the same device type and configuration and have similar tuning configurations, it has been found that the ability to track one another in frequency in response to the tuning voltage is improved compared with a conventional arrangement in which the RF amplifier is of the dual gate FET type and the local oscillator is of the bipolar type.

Returning now to FIG. 1, tuned circuit 300 will be described in detail. As earlier noted, tuned circuit 300 is a series-tuned circuit. Tuned circuit 300 includes inductors 301, 303 and 305, a varactor diode 307 connected in series with a DC blocking capacitor 309 between the input (G1) of amplifier 100 and signal ground. Inductor 305 is coupled in series between varactor diode 307 and the input (G1) of amplifier 100. This has been found to be a beneficial configuration since the inductor 305 tends to isolate varactor 305 from stray capacitances exhibited at the input of amplifier 100. Bandswitching diodes 313 and 311 and associated bypass capacitors 315 and 317, respectively, selectively bypass the circuit point intermediate inductors 301 and 303 and the circuit point intermediate inductors 303 and 305, respectively, to signal ground in accordance with the levels of bandwitching voltages BS1 and BS2. Bandswitching voltages BS1 and BS2 are coupled to bandswitching diodes 313 and 315 through respective high valued isolation resistors 317 and 319, respectively. The tuning voltage (TV) is filtered by a lowpass filter including a resistor 325 and a capacitor 327 and coupled to the cathode of varactor diode 307 through isolation resistors 321 and 324 and inductor 305.

An oscillation range extending circuit 205 associated with oscillation conditioning network 200 includes a capacitor 207 and a varactor diode 209 directly connected in series between the input (G1) of amplifier 100 and signal ground without any intervening elements that would present significant impedance in the frequency range of interest. Capacitor 207 has a capacitance value selected so that it appreciably effects the combined capacitance of capacitor 207 and varactor diode 209. In practice, the specific value of capacitor 207 can be selected to control the range extension and the tracking of local oscillator 7 with RF stage 3. The tuning voltage (TV) is coupled to the cathode of varactor diode 331 through isolation resistor 321. Varactor diodes 307 and 209 are poled with respect to the tuning voltage so that the capacitances they exhibit change in the same sense in response to changes in the magnitude of the tuning voltage. Range-extending circuit 205 extends the oscillation range of oscillator 7 in the following manner.

Figure 1A:
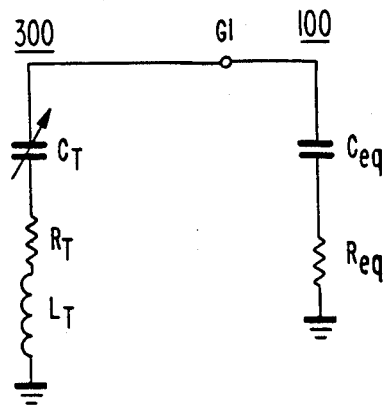
FIG. 1a is a schematic diagram of an equivalent circuit useful in understanding an aspect of the local oscillator shown in FIG. 1.

The equivalent circuit exhibited by amplifier 100 at its input (G1) in the range of oscillation is shown in FIG. 1a and includes an equivalent capacitance element ($C_{eq}$) and a negative resistance element ($-R_{eq}$) connected in series between the first gate electrode (G1) and signal ground. The negative resistance element ($-R_{eq}$) is related to the gain exhibited by the oscillation portion of amplifier 100. The equivalent circuit exhibited by the series-tuned circuit 300 including inductors 301, 303 and 305, varactor diode 307 and DC blocking capacitor 309 at the input (G1) of amplifier 100 includes a variable capacitance element ($C_T$), a resistance element ($R_T$) and an inductance element ($L_T$) connected in series between the first gate electrode (G1) and signal ground. Since DC blocking capacitor 309 has negligible impedance in the frequency range of interest, the variable capacitance element ($C_T$) essentially exhibits the capacitance of varactor diode 307. The resistance $R_T$ corresponds to the loss associated with the tuned circuit, which is primarily associated with varactor diode 307. To sustain oscillation throughout the range of interest (101–509 MHz), the magnitude ($R_{eq}$) of the negative resistance element ($-R_{eq}$) associated with amplifier 100 must be greater than the magnitude of the resistance element ($R_T$) associated with tuned circuit 300. The particular frequency of oscillation is inversely related to the square root of $L_T C$, where C is the combined capacitance of $C_T$ and $C_{eq}$. The combined capacitance of $C_T$ and $C_{eq}$ is given by $C_T C_{eq}/C_T + C_{eq}$. For a wide tuning range, $C_{eq}$ should be as large as possible with respect to the largest value of $C_T$ (corresponding to the lowest frequency of oscillation) so that C can undergo substantially the full range of change of varactor diode 307 ($C_T$).

Adding a fixed capacitor in shunt with the input of amplifier 100 between the first gate electrode (G1) and signal ground increases the value of $C_{eq}$ and therefore tends to extend the tuning range at low frequencies. However, the addition of a fixed shunt capacitor decreases $R_{eq}$ and therefore tends to prevent oscillation, especially at high frequencies. Range extension circuit 205 connected in shunt with the input (G1) of amplifier 100 provides a variable capcitance which increases as the tuning voltage (frequency) decreases and which decreases as the tuning voltage (frequency) increases. As a result, $C_{eq}$ is the largest when $C_T$ is the largest (i.e., at low frequencies) but a value $R_{eq}$ sufficiently large to sustain oscillations is still provided at high frequencies.

The direct connection of range extending circuit 205 between the input (G1) of amplifier 100 and signal ground, rather than through an element having significant impedance in the frequency range of interest, ensures that it will have an appreciable effect on the input capacitance ($C_{eq}$) of amplifier 100.

With regard to range extension network 205, it is noted that while a dual gate FET has the advantages described above, its gain (and therefore $R_{eq}$) is lower than that of a bipolar transistor configured in comparible fashion as a common collector Colpitts type oscillator with its base electrode coupled to a tuned circuit, its emitter electrode coupled to signal ground through an impedance and its collector electrode serving as the output electrode. Therefore, while range extension circuit 205 may be utilized to extend the tuning range of a Colpitts type bipolar transistor oscillator, its advantages are even more significant when employed with an FET oscillator as shown in FIG. 1.

Figure 1C:
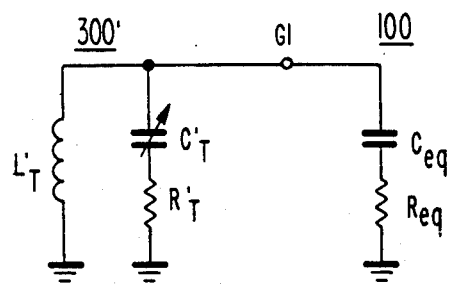
FIG. 1c is a schematic diagram of an equivalent circuit useful in understanding the modification shown in FIG. 1b.
Figure 1B:
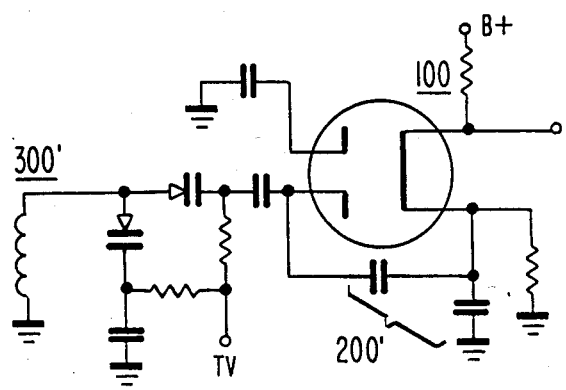
FIG. 1b is a schematic diagram of a modification to the local oscillator shown in FIG. 1.

It is known to employ a parallel tuned circuit in place of a series tuned circuit as is shown in simplified form (without biasing elements) in FIG. 1b. However, it was found that when a parallel tuned circuit was utilized in place of series tuned circuit 300 it was more difficult to obtain the wide tuning range required, even when a range extending circuit was utilized as is shown in FIG. 1b. This can be explained as follows with respect to the equivalent circuit shown in FIG. 1c. In FIGS. 1b and 1c, elements corresponding to the same elements in FIGS. 1 and 1a, respectively, are identified by the same reference designations. The primed (') designations correspond to the modification of replacing the series tuned circuit with a parallel tuned circuit.

With respect to FIG. 1c, the frequency of oscillation is inversely related to the square root of $L_T C'$, where C' is the combined capacitance of $C'_T$ and $C_{eq}$. In this case, the combined capacitance C' is given by $C'_T + C_{eq}$. For a wide tuning range $C_{eq}$ should be small with respect to the lowest value of $C'_T$ (corresponding to the highest frequency of oscillation) so that C' can undergo substantially the full range of change of $C'_T$. The value of $C_{eq}$ can be lowered by connecting a low valued capacitor in series between the parallel tuned circuit and the input of the amplifier. However, the effective loss of the parallel tuned circuit increases as the square of the ratio $C_T/C_{eq}$ and therefore at the high values of $C_T$ (corresponding to the low frequency end of the tuning range), the loss of the parallel tuned circuit may overcome the gain (related to $-R_{eq}$) required for oscillation.

The addition of a varactor diode connected in series between the parallel tuned circuit and the input of the amplifier and poled so that its capacitance varies in the same sense as the varactor diode of the tuned circuit as shown in FIG. 1b tends to extend the tuning range by providing compromise between a relatively low value of $C_{eq}$ at high frequencies and a relatively low effective loss at low frequencies. However, it was found that since the loss of the parallel tuned circuit varies with the square of the ratio $C_T/C_{eq}$ at the lower frequency end of the required tuning range, oscillation was not always reliable when an FET was utilized rather than a higher gain (higher $R_{eq}$) bipolar transistor. Accordingly, the series tuned configuration shown in FIG. 1 is preferred for use with a FET.

As earlier noted, tuning control unit 9 may comprise a phase locked loop. The reliable oscillation of oscillator 7 at low frequencies is particularly important when a phase locked loop type of tuning control system is employed. Phase locked loop tuning control systems usually employ a frequency divider known as a "prescaler" for dividing the very high frequency of the local oscillator signal before it is further divided by a programmable frequency divider according to the channel number and thereafter compared with a reference frequency to generate the tuning voltage. Some prescalers have shown an undesirable tendency to oscillate and if the local oscillator does not oscillate reliably, the phase locked loop may respond to the oscillatory signal of the prescaler rather than to the local oscillator signal. Since the frequency of oscillation of the prescaler tends to be high, the phase locked loop causes the tuning voltage to decrease to attempt to decrease the perceived frequency of oscillation of the local oscillator. This tends to further hamper the ability of the local oscillator to oscillate and the phase locked loop is erroneously "locked" at the wrong frequency. Therefore, range extension network 205 is particularly advantageous when a phase locked loop or other type of closed loop frequency synthesis tuning control system such as a frequency locked loop is employed.

Returning now to FIG. 2, as earlier noted, tuned circuit 500 associated with FET amplifier 400 of RF section 3, like tuned circuit 300 associated with FET amplifier 100 of local oscillator 7, is a series tuned circuit. Series tuned circuit 500 includes a plurality of inductors 501, 503, 505, 507, 509 and 511 which are selectively configured in different series tuned circuits together with a varactor diode 513 (actually two varactor diodes connected in parallel) depending on the tuning band. The particular series tuned circuit configuration is determined by bandswitching diodes 515, 517 and 519, the conduction of which is controlled by the levels of bandswitching voltages BS1 and BS2. The RF input signal is coupled to the junction of inductors 503 and 505. Series tuned circuit 500 is coupled to the first gate electrode (G1) of FET 401 through a coupling capacitor 521.

A varactor diode 523 is connected in shunt with the first gate electrode (G1) and is poled so that its capacitance changes in the same sense as varactor diode 513 in response to changes of the magnitude of the tuning voltage (TV). Varactor diode 523 serves to make the impedance presented by series tuned circuit 500 and the impedance presented at the input (G1) of amplifier 400 more closely match for optimum power transfer throughout the tuning range than otherwise. The function of varactor diode 523 associated with amplifier 500 of RF section 3 is not the same as the function of range extending varactor diode 209 associated with amplifier 100 of local oscillator 7. However, the two similarly connected diodes do tend to make the tuning configurations similar and, therefore, tend to benefit tracking between RF stage 3 and local oscillator 7.

It is noted that inductor 511 is connected in series between varactor diode 513 and the input (G1) of amplifier 500 and corresponds to the similar connection of inductor 305 in series between varactor diode 307 and the input (G1) of amplifier 100 in local oscillator 7. This similarity of tuning configuration also tends to benefit the tracking between RF stage 3 and local oscillator 7.

While the second gate of FET amplifier 401 is bypassed to ground with respect to RF signals, an automatic gain control (AGC) voltage is coupled to it from the IF section of the receiver to control the gain of amplifier 400 as a function of signal strength.

As earlier noted, the output of FET amplifier 400 is coupled to the input of FET amplifier 700 through doubly tuned filter 600 including two inductively coupled series tuned circuits 601 and 603. Series tuned circuits 601 and 603 include respective pluralities of inductors 605, 607 and 609 and 611, 613 and 615 connected in series with respective varactor diodes 617 and 619. Tuned circuits 601 and 603 include respective bandswitching diodes 621 and 623 and 625 and 627. Tuned circuit 601 is coupled to the output (D) of FET amplifier 400 through a coupling capacitor 629. An impedance matching varactor diode 631 is connected in shunt to the output (D) of FET amplifier 400 and has a similar function to impedance matching diode 523 connected in shunt with the input (G1) of amplifier 400. A corresponding impedance matching diode 633 is connected in shunt with the input of FET amplifier 700. Another varactor diode 635 is connected in series between inductor 611 and the input of FET amplifier 700 and also serves as an impedance matching device. Inductor 609 is connected in series between the output (D) of amplifier 400 and varactor diode 617 and inductor 611 is connected in series between the input of amplifier 700 and varactor diode 619. Like inductor 511 associated with RF amplifier 400 and inductor 305 associated with local oscillator 7, inductors 605 and 611 serve to isolate the respective varactor diodes from stray capacitances. Here again, since tuned circuits 601 and 603 are configured in similar manner to tuned circuit 300 of local oscillator 7 and are loaded in similar fashion (noting that a relatively high impedance is exhibited at the drain as well as the gate electrode of an FET), tracking between RF stage 3 and local oscillator 7 tends to be benefited.

While tracking is benefited by the similar tuning circuit and amplifier configurations of RF stage 3 and local oscillator 7, it has been found desirable because of the relatively large tuning range in the present embodiment to employ another enhancement to tracking. Specifically, referring back to FIG. 1, it is noted that a bandswitching diode 333 and a low value capacitor 335 are connected in series across varactor diode 307 and inductor 305. Bandswitching voltage BS1 is applied to the cathode of bandswitching diode 333 through a network including a filter capacitor 337 and an isolation resistor 339. The anode of bandswitching diode 333 is coupled to signal ground through inductors 301 and 303. Bandswitching diode 333 is rendered conductive in the lowest tuning range when bandswitching voltage BS1 is at the low level ($-12$ volts). The additional capacitance has been found to aid tracking at the upper frequency end of the lowest tuning range.

A type 1SV161 varactor diode commercially available from Toshiba and type BF994 or 3SK137 FETs commercially available from Siemens and Hitachi, respectively, are suitable for use in the circuitry shown in the various figures.

While the present invention has been described in terms of the VHF section of a tuner, it can also be utilized in the UHF section. For UHF application, capacitor 203 of the oscillation conditioning network 200 of local oscillator 7 may comprise an internal capacitance element. These and other modifications are intended to be within the scope of the invention defined by the following claims.

I claim:

1. Apparatus including a tunable oscillator, comprising:
   a dual gate field effect transistor (FET) having first and second gate electrodes, a source electrode and a drain electrode;
   impedance means for coupling said source electrode to a point of reference potential;
   oscillation conditioning means connected between said first gate electrode and said source electrode for conditioning said FET to oscillate in a predetermined frequency range;
   frequency determining means including a varactor diode which exhibits a capacitance which changes in response to changes in the magnitude of a tuning voltage and an inductance element coupled to said first gate electrode for determining the oscillation frequency at which said FET oscillates;
   bypass means for effectively connecting said second gate electrode to said point of reference potential through a negligible impedance in said predetermined frequency range; and
   utilization means coupled to said drain electrode for receiving an output signal at said oscillation frequency.

2. The apparatus defined in claim 1 wherein:
   said FET is of the metal oxide semiconductor (MOS) type.

3. The apparatus recited in claim 1 wherein:
   said utilization means comprises mixer means for mixing said output signal provided at said drain electrode with an RF signal to produce an IF signal.

4. The apparatus defined in claim 1 wherein:
   said oscillation conditioning means comprises a first capacitance element coupled between the first gate electrode and the source electrode and a second capacitance element coupled between said source electrode and said point of reference potential.

5. The apparatus recited in claim 4 wherein:
   said oscillation conditioning means includes range extending means including a second varactor diode also responsive to said tuning voltage for ensuring that said FET oscillates throughout said predetermined range.

6. The apparatus recited in claim 1 wherein:
   said inductance element and said first mentioned varactor diode of said frequency determining means are connected in series between said first gate electrode and said point of reference potential; and
   said second mentioned varactor diode of said range extending means is coupled between said first gate electrode and said point of reference potential and is poled to exhibit a capacitance which changes in the same sense as the capacitance of said first mentioned varactor diode changes in response to changes in the magnitude of said tuning voltage.

7. Apparatus comprising:
   a dual gate metal oxide semiconductor (MOS) field effect transistor (FET) having first and second gate electrodes, a source electrode and a drain electrode;
   impedance means coupled between said source electrode and a point of reference potential;
   oscillation conditioning means connected between said first gate electrode and said source electrode for conditioning said FET to oscillate in a predetermined range;
   frequency determining means including a varactor diode exhibiting a capacitance which changes in response to changes in the magnitude of a tuning voltage and an inductor for determining the particular oscillation frequency at which said FET oscillates;
   bypass means for effectively connecting said second gate electrode to said point of reference potential through a negligible impedance in said predetermined range;
   RF means for providing an RF signal; and
   mixer means coupled to said RF means to receive said RF signal and coupled to said drain electrode of said FET to receive a local oscillator signal at said oscillation frequency for combining said RF signal and said local oscillator signal to produce an IF signal.

8. The apparatus recited in claim 7 wherein:
   said oscillation means includes range extending means including a second varactor diode also responsive to said tuning voltage for ensuring that said FET oscillates throughout said predetermined frequency range.

9. The apparatus recited in claim 8 wherein:
   said inductance element and said first mentioned varactor diode of said frequency determining means are coupled in series between said first gate electrode and said point of reference potential; and
   said second varactor diode of said range extending means is coupled between said first gate electrode and said point of reference potential and is poled to exhibit a capacitance which changes in the same sense as the capacitance of said first mentioned varactor diode changes in response to changes in the magnitude of said tuning voltage.

10. Apparatus comprising:
    a dual gate metal oxide semiconductor (MOS) field effect transistor (FET) having first and second gate electrodes, a source electrode and a drain electrode;
    impedance means coupled between said source electrode and a point of reference potential;
    oscillation conditioning means connected between said first gate electrode and said source electrode for conditioning said FET to oscillate in a predetermined range;
    frequency determining means including an inductor and a varactor diode coupled to said first gate electrode and responsive to a tuning voltage for determining the particular oscillation frequency at which said FET oscillates;
    said oscillation conditioning means includes range extending means including a second varactor diode also responsive to said tuning voltage for ensuring that said FET oscillates throughout said predetermined frequency range;
    bypass means for effectively connecting said second gate electrode to said point of reference potential through a negligible impedance in said predetermined range;
    RF means for providing an RF signal; and
    mixer means coupled to said RF means to receive said RF signal and coupled to said drain electrode of said FET to receive a local oscillator signal at said oscillation frequency for combining said RF signal and said local oscillator signal to produce an IF signal.

11. The apparatus recited in claim 8 wherein:
said inductance element and said first varactor diode of said frequency determining means are coupled in series between said first gate electrode and said point of reference potential; and
said second varactor diode of said range extending means is coupled between said first gate electrode and said point of reference potential and is poled to exhibit a capacitance which changes in the same sense as the capacitance of said first varactor diode changes in response to changes in the magnitude of said tuning voltage.

* * * * *